United States Patent
Hosotani et al.

(10) Patent No.: US 9,269,889 B2
(45) Date of Patent: Feb. 23, 2016

(54) SEMICONDUCTOR MEMORY DEVICE AND MANUFACTURING METHOD THEREOF

(71) Applicants: Keiji Hosotani, Seoul (KR); Sumio Ikegawa, Seoul (KR); Tatsuya Kishi, Seongnam-si (KR)

(72) Inventors: Keiji Hosotani, Seoul (KR); Sumio Ikegawa, Seoul (KR); Tatsuya Kishi, Seongnam-si (KR)

(*) Notice: Subject to any disclaimer, the term of this patent is extended or adjusted under 35 U.S.C. 154(b) by 0 days.

(21) Appl. No.: 14/479,163

(22) Filed: Sep. 5, 2014

(65) Prior Publication Data

US 2015/0263264 A1    Sep. 17, 2015

Related U.S. Application Data

(60) Provisional application No. 61/952,033, filed on Mar. 12, 2014.

(51) Int. Cl.
| | |
|---|---|
| H01L 29/82 | (2006.01) |
| H01L 43/02 | (2006.01) |
| H01L 43/08 | (2006.01) |
| H01L 43/12 | (2006.01) |
| H01L 27/22 | (2006.01) |

(52) U.S. Cl.
CPC .............. *H01L 43/02* (2013.01); *H01L 27/222* (2013.01); *H01L 43/08* (2013.01); *H01L 43/12* (2013.01)

(58) Field of Classification Search
CPC ........ H01L 27/22; H01L 27/222; H01L 43/08; H01L 43/12
USPC ............................................. 257/421
See application file for complete search history.

(56) References Cited

U.S. PATENT DOCUMENTS

| 7,473,951 B2 | 1/2009 | Kim et al. |
| 8,199,550 B2 | 6/2012 | Okayama |
| 2010/0232210 A1* | 9/2010 | Kajiyama et al. ............ 365/148 |

FOREIGN PATENT DOCUMENTS

JP      4987830 B2    7/2012

* cited by examiner

*Primary Examiner* — Douglas Menz
(74) *Attorney, Agent, or Firm* — Holtz, Holtz & Volek PC

(57) ABSTRACT

According to one embodiment, a semiconductor memory device comprises a memory cell array. The memory cell array has a plurality of magnetic tunnel junction (MTJ) elements. Each of the MTJ elements has a first magnetic layer, a second magnetic layer and a non-magnetic layer therebetween, and a hard mask layer is arranged above the second magnetic layer. The plurality of MTJ elements have a first MTJ element having a first hard mask layer and a second MTJ element having a second hard mask layer, and a dimension of, the first hard mask layer is greater than that of the second hard mask layer.

9 Claims, 7 Drawing Sheets

SEMICONDUCTOR MEMORY DEVICE AND MANUFACTURING METHOD THEREOF

CROSS-REFERENCE TO RELATED APPLICATIONS

This application claims the benefit of U.S. Provisional Application No. 61/952,033, filed Mar. 12, 2014, the entire contents of which are incorporated herein by reference.

FIELD

Embodiments described herein relate generally to a semiconductor memory device applied to, for example, a magnetoresistive random access memory (MRAM) and a method for manufacturing the semiconductor memory device.

BACKGROUND

When a provisional pattern layout of a memory cell array is determined in the process of manufacturing, for example, a semiconductor memory device, the pattern layout is used and an optical proximity correction (OPC), etc., are executed to determine a mask pattern. A hard mask is manufactured based on the mask pattern. An MRAM having a magnetic tunnel junction (MTJ) element is also manufactured by a similar process.

Also, a memory cell array region generally has a plurality of patterns corresponding to memory cells at regular intervals, and a sufficient number of dummy cells to stabilize a critical dimension (CD) of the memory cells are arranged in an end portion of the memory cell array region.

DETAILED DESCRIPTION

Figure 1:
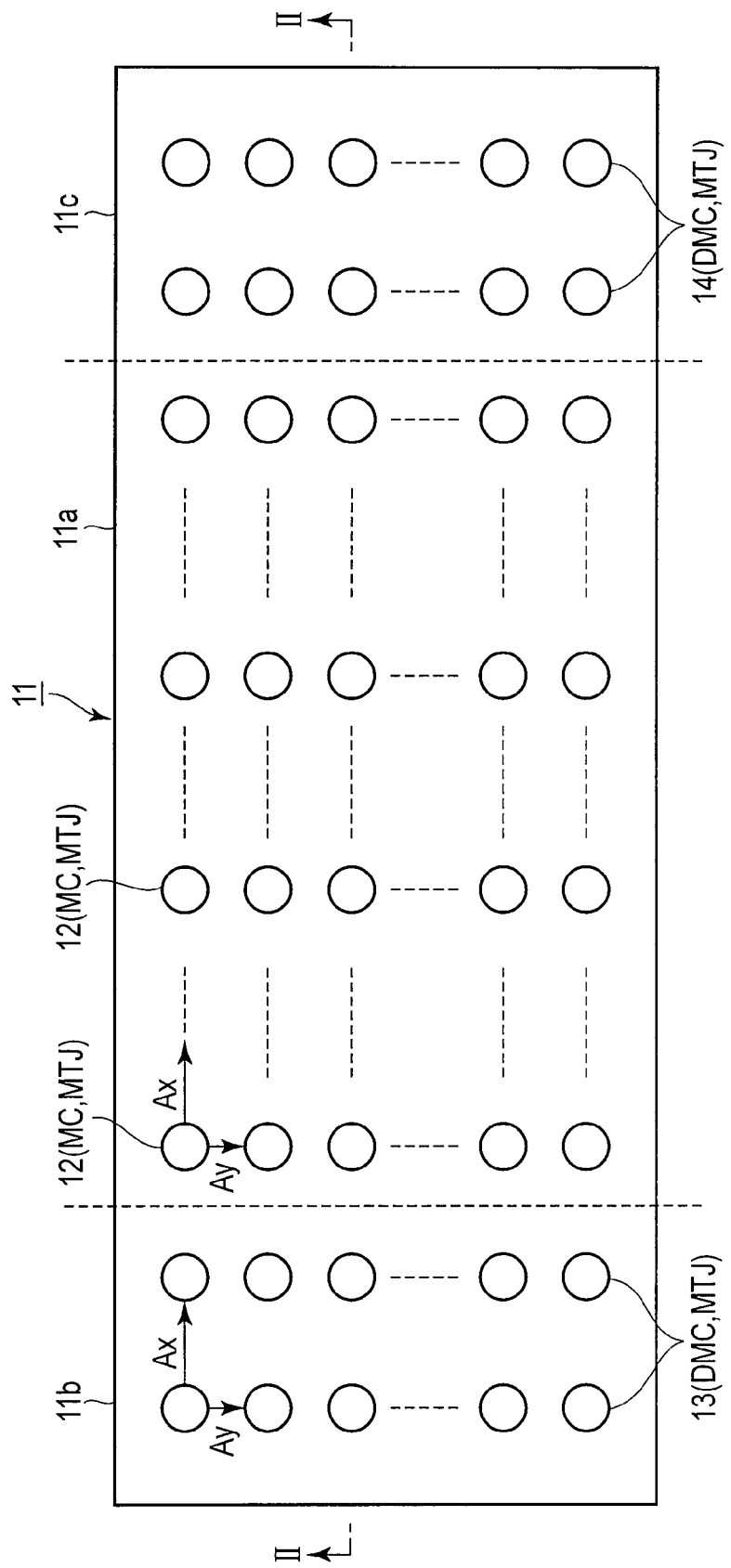
FIG. 1 is a schematic plan view of a semiconductor memory device according to a first embodiment.

In general, according to one embodiment, a semiconductor memory device comprises a memory cell array. The memory cell array has a plurality of magnetic tunnel junction (MTJ) elements. Each of the MTJ elements has a first magnetic layer, a second magnetic layer and a non-magnetic layer therebetween, and a hard mask layer is arranged above the second magnetic layer. The plurality of MTJ elements have a first MTJ element having a first hard mask layer and a second MTJ element having a second hard mask layer, and a dimension of the first hard mask layer is greater than that of the second hard mask layer.

The MTJ element has a large aspect ratio in an MRAM. Thus, a side surface of the MTJ element is sometimes inclined such that a lower portion of the MTJ element is widened in comparison with an upper portion thereof after etching processing. The angle of inclination (taper angle) of the side surface of the MTJ element changes depending on a position of the memory cell array. Accordingly, if the MTJ element has a taper, the angle of inclination of a side surface of a barrier layer or a storage layer changes. For example, when the angle of inclination of the storage layer is increased, a magnetic property of the MTJ element, for example, a leakage magnetic field (hereinafter referred to as Hshift) increases. When Hshift increases, deterioration of the data retention characteristic of the MTJ element increases.

Also, a dummy cell is arranged around the memory cell array in the MRAM. The dummy cell controls a magnetic property resulting from a shape of a memory cell, for example, a variation of Hshift, and is not actually accessed. Recently, the magnetic property of a memory cell varies widely along with scaling of the memory cell. Thus, the number of dummy cells tends to increase and an effective area in a chip is reduced, which causes a problem.

Furthermore, even if a CD variation of the MTJ element is eliminated, the shape of the MTJ element changes by an influence of process integration. For example, if a hard mask is dished by chemical mechanical polishing (CMP) processing, a substantial film thickness of the hard mask before the processing of the MTJ element changes. Thus, the taper angle of the MTJ element after etching changes, and the data retention characteristic of the MTJ element deteriorates.

Also, an interval in the row direction of the MTJ element arranged in the memory cell array is sometimes different from that in the column direction. In this case, a distribution of a taper of the MTJ element is different between the row direction and the column direction. That is, for example, MTJ elements located in an area from the central portion to the m-th MTJ element in the row direction of the memory cell array have a large taper, or MTJ elements located in an area from the central portion to the n-th MTJ element in the column direction have a large taper. In this manner, the taper of the MTJ element is sometimes different between the row direction and the column direction.

First Embodiment

Various embodiments will be described hereinafter with reference to the accompanying drawings. In all figures, the same portions are denoted by the same reference numbers.

FIG. 1 illustrates a semiconductor memory device applied to a first embodiment, for example, an MRAM. In FIG. 1, a semiconductor substrate 11 includes a memory cell array region 11a and dummy cell regions 11b and 11c. Although FIG. 1 illustrates only the dummy cell regions 11b and 11c located in both ends of the memory cell array region 11a in the row direction, dummy cell regions not shown are also provided in both ends of the memory cell array region 11a in the column direction.

In the memory cell array region 11a, a plurality of MTJ elements 12 comprising memory cells MCs are arranged in an upper portion of the semiconductor substrate 11 in the row direction and the column direction. An interval of the adjacent MTJ elements 12 in the row direction is, for example, Ax, and an interval of the adjacent MTJ elements 12 in the column direction is, for example, Ay. Intervals Ax and Ay are different from each other. Specifically, interval Ax in the row direction is set to be wider than interval Ay in the column direction (Ax>Ay).

In the dummy cell region 11b, a plurality of MTJ elements 13 comprising dummy cells DMCs are arranged in the row direction and the column direction. In the dummy cell region 11c, a plurality of MTJ elements 14 comprising dummy cells DMCs are arranged in the row direction and the column direction. In dummy cells DMCs, as well as memory cells MCs, interval Ax in the row direction is set to be wider than interval Ay in the column direction.

Figure 2:
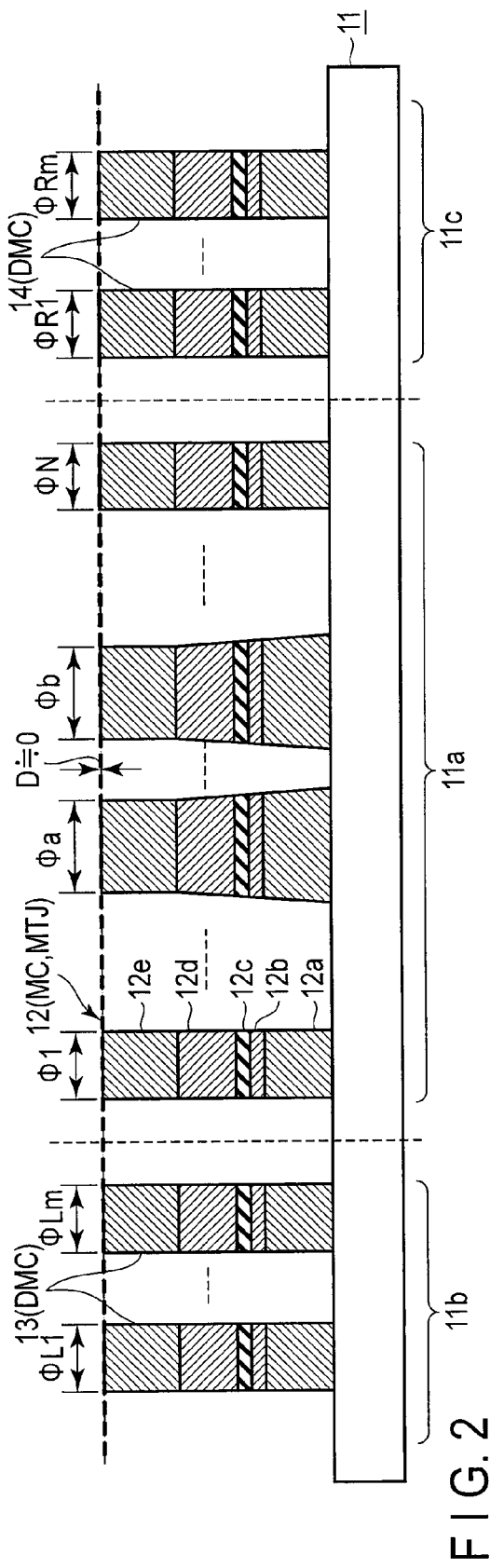
FIG. 2 illustrates the first embodiment, and is a sectional view of a structure of a memory cell array which is taken along line II-II in FIG. 1.

FIG. 2 is a sectional view taken along line II-II shown in FIG. 1. In the memory cell array region 11a, the MTJ element 12 comprising each memory cell MC comprises a lower electrode 12a provided on the semiconductor substrate 11, a storage layer 12b, a tunnel barrier layer (hereinafter also referred to simply as a barrier layer) 12c as a non-magnetic layer, a reference layer and a shift cancelling layer 12d, and a hard mask layer 12e as an upper electrode stacked on the lower electrode 12a.

The MTJ elements 13 and 14 comprising dummy cells DMCs arranged in the dummy cell regions 11b and 11c also have the same structure as the MTJ elements 12 of the memory cell array region 11a. However, the dummy cells DMCs are different from the memory cells MCs in circuit connection, and do not function as storage elements. They are not actually accessed.

Figure 3:
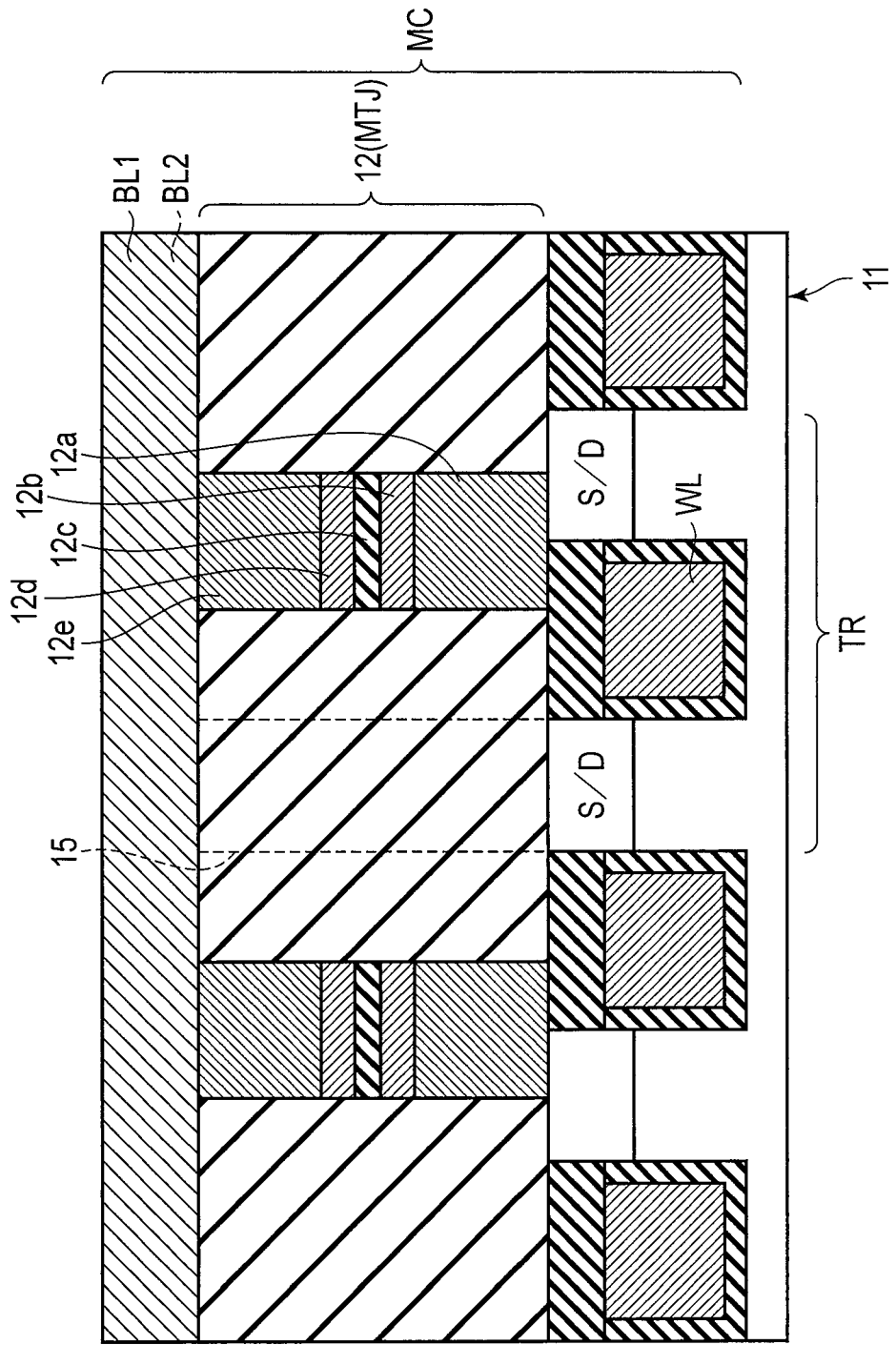
FIG. 3 is a schematic sectional view of a memory cell to which the first embodiment is applied.

FIG. 3 illustrates the structure of a memory cell MC. Source/drain regions S/Ds comprising a selection transistor TR are provided inside the semiconductor substrate 11, and word lines WLs comprising gate electrodes of transistors are provided between the source/drain regions. The above-described MTJ element 12 is provided on one of source/drain regions S/Ds. A first bit line BL1 is provided on the MTJ element 12. The first bit line BL1 is electrically connected to the hard mask layer 12e as an upper electrode. Also, a contact 15 is provided on the other one of source/drain regions S/Ds, and is electrically connected to a second bit line BL2. The second bit line BL2 is arranged parallel to the first bit line BL1.

Figure 4:
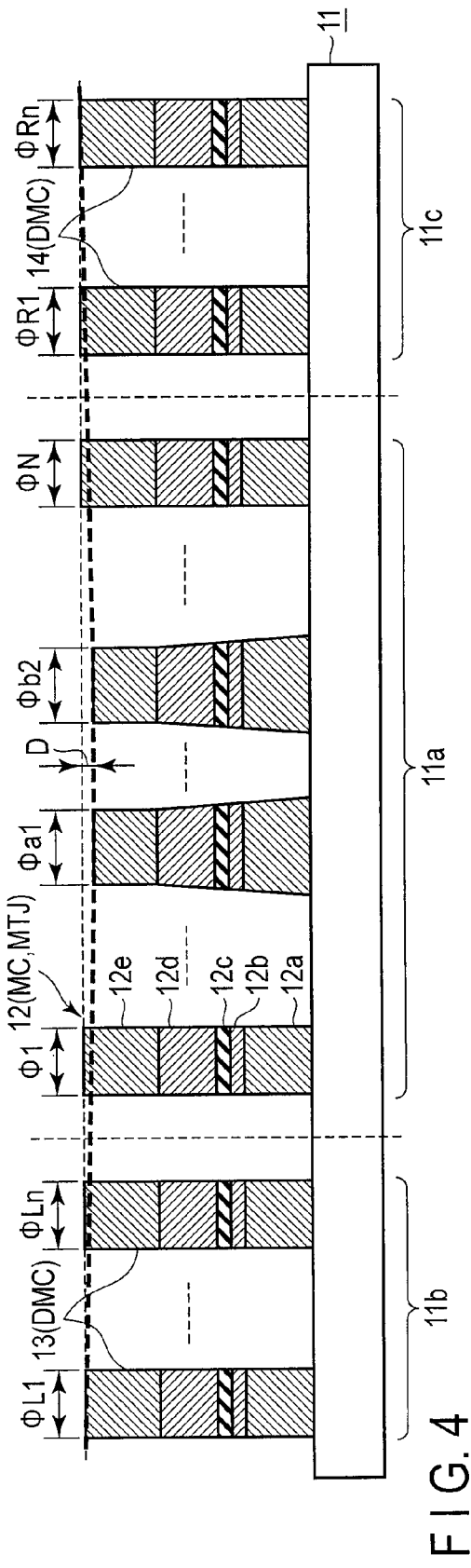
FIG. 4 is a comparative example of FIG. 2, and is a sectional view of the structure of the memory cell array.

As shown in FIG. 4, in the process of manufacturing a semiconductor memory device, for example, the width of the hard mask layer 12e in the memory cell array region 11a processed using a lithography technique using an OPC is generally set to be constant ($\phi1=\phi a1=\phi b2=\phi N$). Furthermore, to stabilize the magnetic property of the MTJ element 12, a sufficient number of dummy cells DMCs are arranged at both sides of the memory cell array region 11a. The widths of the dummy cells DMCs are also set to be constant ($\phi L1=\phi Ln=\phi R1=\phi Rn$).

However, as described above, the MTJ elements 12 in the memory cell array region 11a is affected by processes other than the lithography, for example, dishing (indicated by broken lines and D in FIG. 4) in CMP processing, and a film thickness of the hard mask before etching of the MTJ elements changes.

Furthermore, since the etching rate of the hard mask layer 12e and that of each layer included in the MTJ element 12 below the hard mask layer 12e are set to be constant, the dimension of the hard mask layer 12e is actually difficult to equally set. Accordingly, a taper of the MTJ element 12 varied due to the variation of the dimension of the hard mask layer 12e, and a magnetic property was difficult to stabilize.

Then, in the first embodiment, the CD of the MTJ element 12 in the memory cell array region 11a is changed based on process information such as lithography and CMP. That is, as shown in FIG. 2, in the first embodiment, widths $\phi a$ and $\phi b$ of the hard mask layer of the MTJ element 12 which is located, for example, in the central portion of the memory cell array region 11a and has a large taper is set to be wider than widths $\phi 1$ and $\phi N$ of the hard mask layer of the MTJ element 12 which is located in a peripheral portion of the memory cell array region 11a and hardly tapers ($\phi a, \phi b \gg \phi 1, \phi N$).

Specifically, the dimension of the hard mask layer located in the central portion is set to be greater than that of the hard mask layer located in the peripheral portion by, for example, 10% or more. Also, the taper angle (angle of inclination of the side surface) of the MTJ element located in the central portion is set to be greater than that of the MTJ element located in the peripheral portion by, for example, three degrees or more.

The taper of the MTJ element 12 changes depending on a position in the memory cell array region 11a. In the first embodiment, if the MTJ element 12 having the largest taper is present in the central portion of the memory cell array region 11a, the dimension (width) of the hard mask layer 12e of the central portion is set to be wider than that of the hard mask layer 12e of the peripheral portion. By widening the hard mask layer 12e, the variation of the dimension of the hard mask layer 12e can be controlled and the variation of the taper of the MTJ element 12 can be controlled at the time of etching processing.

Furthermore, by widening the hard mask layer 12e, the influence of dishing can be reduced (D≅0), and the aspect ratio of the MTJ element 12 can be kept constant at the time of CMP processing, as shown in FIG. 2.

Thus, the variation of the taper of the MTJ element 12 in the memory cell array region 11a can be controlled at the time of etching processing.

As described above, by controlling the variation of the taper of the MTJ element 12 in the memory cell array region 11a, the variation of the dimension (width) of the storage layer 12b can be controlled. Thus, the magnetic property of the MTJ element 12 in the memory cell array region 11a, for example, Hshift can be made constant. Thus, the data retention characteristic can be improved.

In addition, since the variation of Hshift of the MTJ element 12 in the memory cell array region 11a is small, the dummy cell region can be reduced. Thus, since the dummy cell region with respect to the chip can be reduced, the chip area can be reduced.

Figure 5:
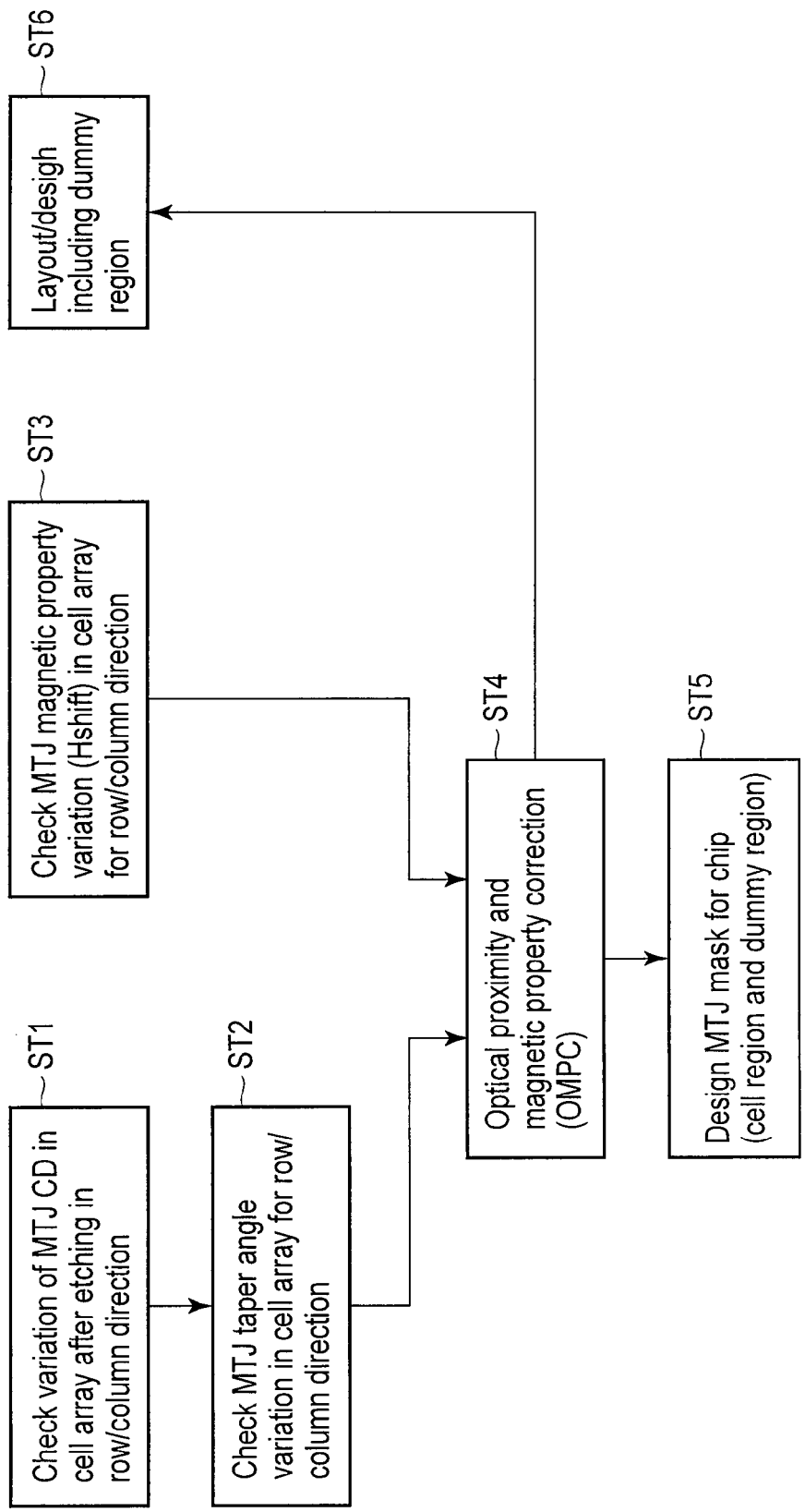
FIG. 5 is a flowchart illustrating a manufacturing method according to the first embodiment.

FIG. 5 illustrates an example of methods for manufacturing the MTJ elements according to the first embodiment.

As shown in FIG. 5, when the MTJ elements are manufactured, materials of a storage layer, a barrier layer, a reference layer and a shift cancelling layer are first laminated, and they are etched using a preset hard mask layer. After the etching processing is completed, the CD of the plurality of MTJ elements 12 arranged in the column direction and the row direction of the memory cell array region 11a, for example, the variation of the dimension of the hard mask layer is checked (ST1).

Then, the variation of the taper of the MTJ element 12 in the memory cell array region 11a, that is, the change of the angle of inclination of the side surface of the MTJ element 12 is checked with respect to the column direction and the row direction (ST2).

Furthermore, the variation of the magnetic property of the MTJ element 12 in the memory cell array region 11a, for example, Hshift is checked with respect to the column direction and the row direction (ST3).

After that, the OPC is executed based on the variation of the CD of the MTJ element 12 and that of the taper of the MTJ element 12. Furthermore, the correction of the magnetic property is executed based on the variation of the magnetic property of the MTJ element 12 (ST4).

Then, the dimension of the mask pattern for forming the hard mask layer 12e is determined based on the results of the OPC and the correction of the magnetic property (collectively referred to as OMPC) (ST5). That is, the dimension of the mask pattern is made larger than those in the other portions in the memory cell array region including the dummy cell region in accordance with a portion of the MTJ element 12 having a large taper and a large variation of the magnetic property.

Furthermore, the correction result in step ST4 is fed back to step ST6, and layouts of the memory cell array region 11a and the dummy cell regions 11b and 11c are designed. That is, since the variation of the magnetic property of the MTJ element 12 in the memory cell array region 11a is controlled with respect to the row direction and the column direction, processing of reducing the number of dummy cells in the row direction and the column direction, etc., are performed.

That is, while the number of dummy cells DMCs is n (φL1-φLn, φR1-φRn) in the layout before correction shown in FIG. 4, the number of dummy cells DMCs is reduced to m (<n) (φL1-φLm, φR1-φRm) in the first embodiment shown in FIG. 2. In this manner, the number of dummy cells is reduced and the overall structure of the chip is restructured.

Figure 6:
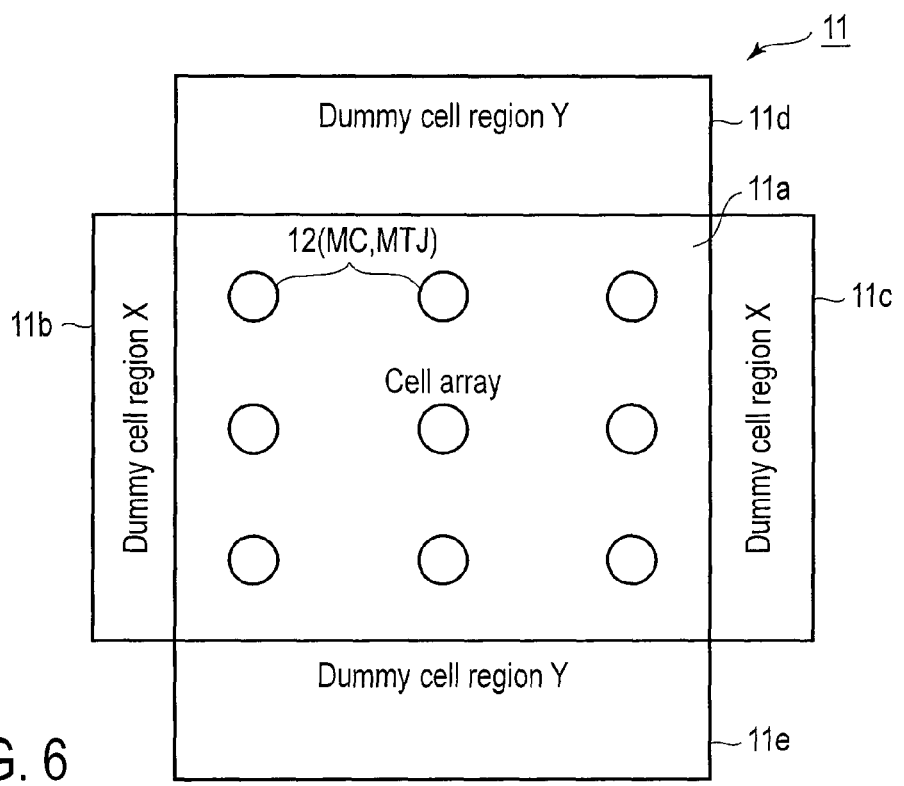
FIG. 6 is a plane view illustrating a relationship between the memory cell array and a dummy cell array.

It should be noted that as described above, MTJ element mutual distance Ax in the row direction is set to be wider than MTJ element mutual interval Ay in the column direction of the memory cell array region 11a. Thus, the influence of an optical proximity effect in the row direction is smaller than that of the optical proximity effect in the column direction. Thus, as shown in FIG. 6, the area of the dummy cell regions 11b and 11c in the row direction can be made smaller than that of the dummy cell regions 11d and 11e in the column direction.

According to the first embodiment, the dimension of the hard mask layer 12e of the MTJ element 12 having a large taper in the memory cell array region 11a is set to be greater than those of the hard mask layers 12e of the other MTJ elements 12. This allows the variation of the magnetic property of each MTJ element 12 in the memory cell array region 11a to be suppressed. Thus, the data retention characteristic of the memory cell can be improved.

Figure 7:
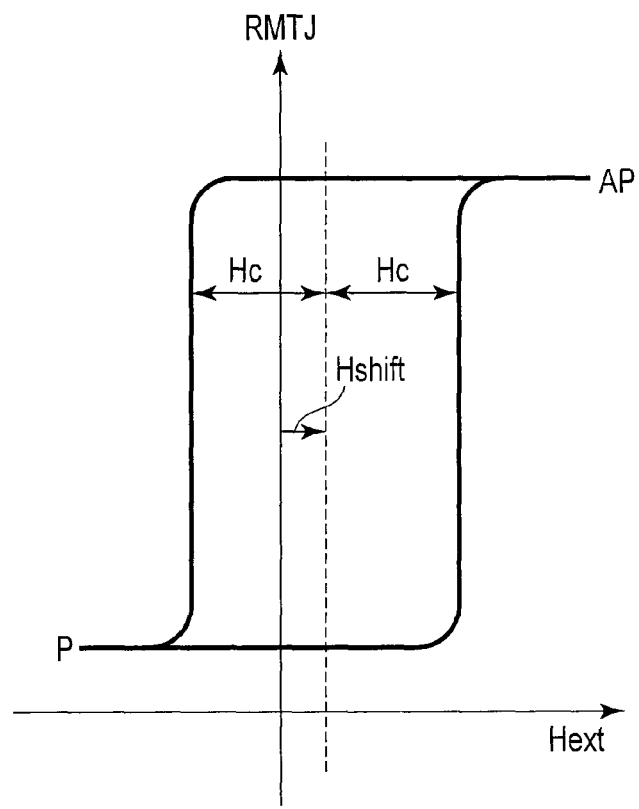
FIG. 7 illustrates a magnetic property.

FIG. 7 illustrates a magnetic property, for example, leakage magnetic field Hshift, and illustrates a state in which Hshift is produced in a state in which a magnetic field is applied from the outside. In FIG. 7, horizontal axis Hext indicates the magnetic field from the outside, and vertical axis RMTJ indicates resistance of the memory cell. If leakage magnetic field Hshift is produced, holding force Hc is difficult to keep equally with respect to a zero magnetic field. Thus, in the example shown in FIG. 7, a margin, for example, on the parallel side (P) is reduced, and inversion from the antiparallel side (AP) to side P is easily caused. That is, the data retention characteristic deteriorates. However, in the first embodiment, since each leakage magnetic field Hshift can be reduced and holding force Hc can be improved, the data retention characteristic of the memory cell can be improved.

Also, in the first embodiment, since the variation of the magnetic property of each MTJ element in the memory cell array region 11a can be controlled, the number of dummy cells in the row direction and the column direction of the memory cell array region 11a can be reduced. Thus, the chip area can be reduced.

It should be noted that the first embodiment is provided on the premise that the MTJ element 12 located in the central portion of the memory cell array region 11a has a large taper, and the dimension of the hard mask layer 12e located in the central portion is set to be larger than that of the hard mask layer 12e of the peripheral portion. However, the embodiment is not limited to this case. The MTJ element 12 of the peripheral portion of the memory cell array region 11a may have a large taper, depending on adjustment of the process. In this case, the dimension of the hard mask layer 12e of the peripheral portion of the memory cell array region 11a can be set to be larger than that of the central portion. An advantage similar to that of the first embodiment can be obtained even by such a structure.

Second Embodiment

In the first embodiment, since the variation of the magnetic property of the MTJ element 12 in the memory cell array region 11a is controlled, the dimension of the hard mask layer 12e of the MTJ element 12 having a large taper is set to be larger than those of the hard mask layers of other the MTJ elements 12e in the memory cell array region 11a.

On the other hand, since in a second embodiment, the variation of the magnetic property of the MTJ element 12 in the memory cell array region 11a is controlled, the variation of the dimension of the hard mask layer 12e is controlled within a constant range, and the variation of the taper of the MTJ element 12 is accepted.

According to a simulation result, it is proved that in the case where, for example, the dimension of the hard mask layer varies, the variation of Hshift becomes larger if the MTJ element 12 has a constant taper angle.

Figure 8:
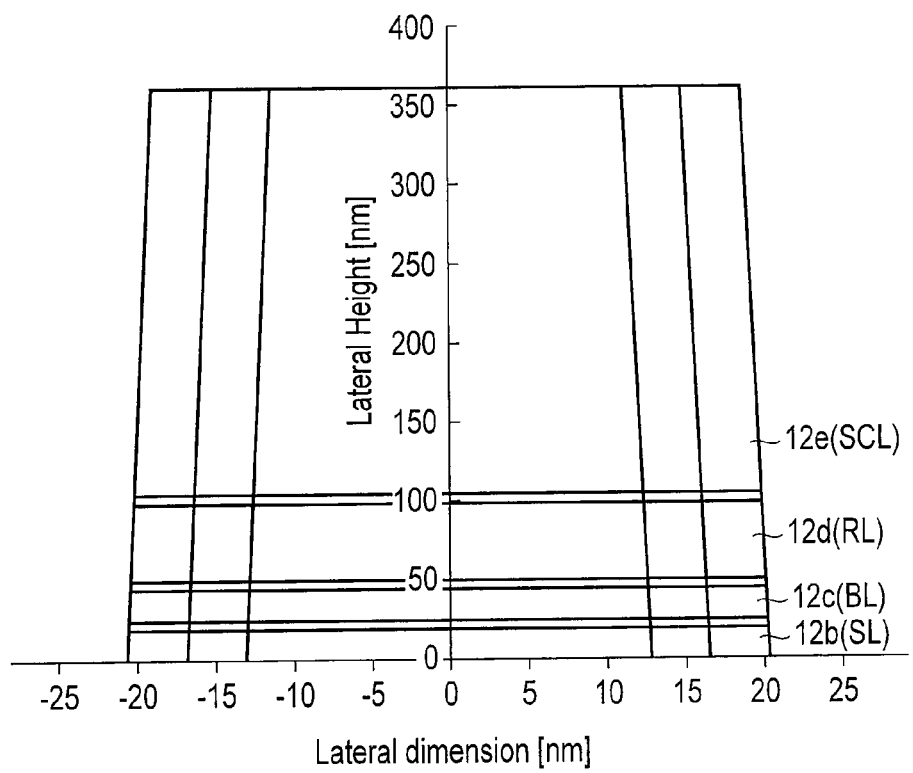
FIG. 8 is a comparative example of a second embodiment, and illustrates a relationship between a dimension of a hard mask and a taper angle of an MTJ element.

FIG. 8 illustrates a simulation result, and illustrates a relationship between a dimension (lateral dimension) of a hard mask layer of the MTJ element 12 and a taper of the MTJ element 12. In FIG. 8, 12b (SL) denotes a storage layer, 12c (BL) denotes a tunnel barrier layer, 12d (RL) denotes a reference layer, and 12e (SCL) denotes a shift cancelling layer. Although the hard mask layer is not shown in FIG. 8, the dimension of the hard mask layer is equal to that of an upper portion of the shift cancelling layer 12e.

FIG. 8 shows that the taper of the MTJ element does not change in a state where the dimension of the hard mask layer changes, for example, into three types. However, the dimensions of the storage layer 12b, the barrier layer 12c, the reference layer 12d and the shift cancelling layer 12e of MTJ element change in accordance with the change of the dimension of the hard mask layer.

Figure 9:
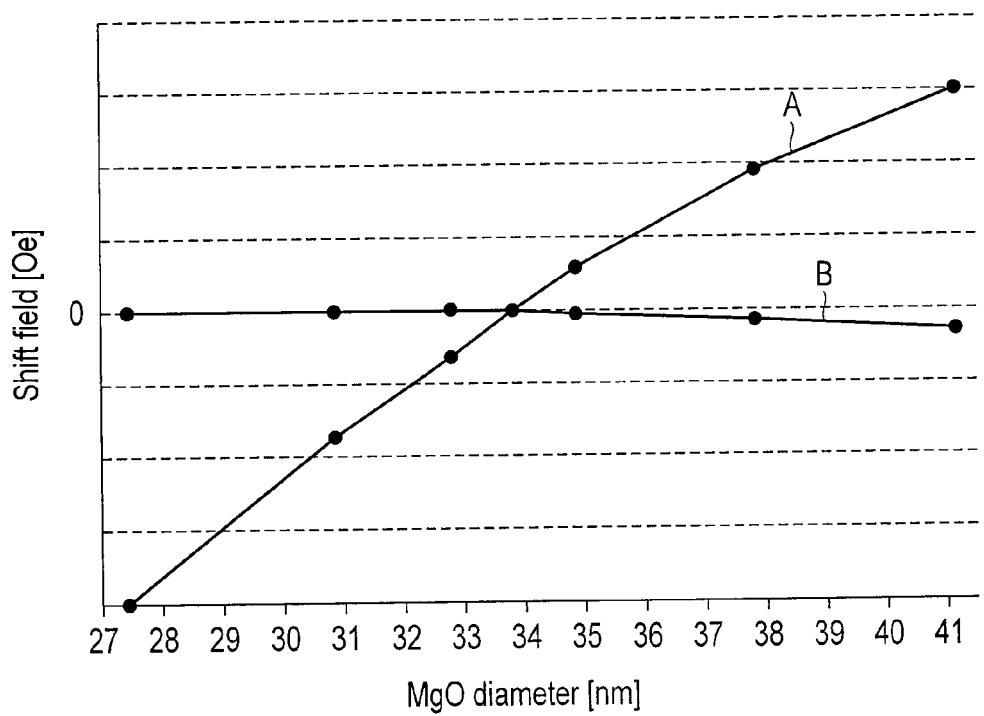
FIG. 9 illustrates a relationship between a change in dimension and a magnetic property of the MTJ element according to the second embodiment along with a comparative example.

FIG. 9 illustrates a relationship between a change in dimension of the hard mask layer, that is, a change in dimension of the barrier layer (MgO) 12c and a change in magnetic property (Hshift: shift field). Characteristic A shown in FIG. 9 represents a result obtained by simulating the variation of the magnetic property under a condition as shown in FIG. 8.

As indicated by characteristic A in FIG. 9, in the case where the dimension of the hard mask layer varies, the dimension of the barrier layer (MgO) 12c changes also when the MTJ element has a constant taper. According to this, it is found that the variation of Hshift greatly changes.

Figure 10:
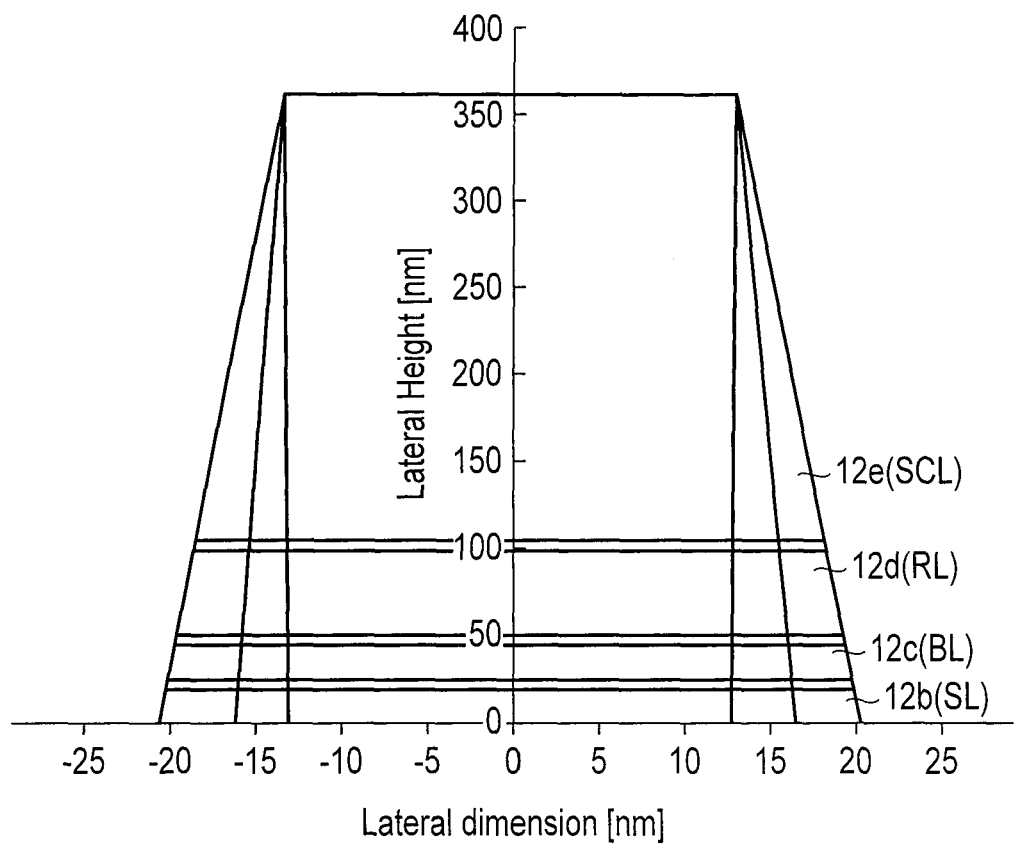
FIG. 10 illustrates a relationship between a dimension of each portion and a taper of the MTJ element according to the second embodiment.

On the other hand, FIG. 10 illustrates a simulation result according to the second embodiment. In the second embodiment shown in FIG. 10, the dimension of the hard mask layer is kept constant, and a taper (angle of inclination of a side surface) of the MTJ element is changed. In this case, the dimension of the barrier layer (MgO) 12c changes in accordance with the change of the taper of the MTJ element. However, as indicated by characteristic B in FIG. 9, even if the dimension of the barrier layer (MgO) 12c changes, Hshift hardly changes. That is, in the case where the dimension of the hard mask layer is strictly controlled as in the second embodiment, it is found that the variation of Hshift can be controlled also when the MTJ element has a taper.

Then, in the second embodiment, the dimension of the hard mask layer 12e of the memory cell array region 11a is set to be uniform in the central portion and the peripheral portion of the memory cell array region 11a, and the variations of the tapers of the MTJ element 12 located in the central portion of the memory cell array region 11a and the MTJ element 12 located in the peripheral portion are accepted.

As described above, to make strictly uniform the dimension of the hard mask layer 12e, the etching rate of the hard mask layer is set to be under 10% of that of each layer of the MTJ element 12. That is, although the time required for etching the hard mask layer 12e becomes somewhat long, the variation of the dimension of the hard mask layer 12e can be strictly controlled.

Also, such etching processing allows the variation of the dimension of the hard mask layer 12e to be reduced to 10% or less compared to the variation of the dimension of the barrier layer 12c of the MTJ element 12.

According to the second embodiment, the dimension of the hard mask layer 12e can be made strictly uniform by controlling the etching rate of the hard mask layer 12e to be 10% or less compared to that of each layer of the MTJ element 12. Even if the variation of the taper of the MTJ element 12 is caused, the variation of the magnetic property of the MTJ element 12, for example, Hshift can be reduced by making uniform the dimension of the hard mask layer 12e. Thus, the data retention characteristic can be improved.

Also, since Hshift can be controlled, the number of dummy cells can be reduced. Thus, the chip area can be reduced.

In addition, the variation of the dimension can be indicated as a distribution of the dimension, and standard deviation may be used when two or more distributions are compared.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array comprising a plurality of magnetic tunnel junction (MTJ) elements, each of the MTJ elements comprising a first magnetic layer, a second magnetic layer and a non-magnetic layer arranged between the first and second magnetic layers, and a hard mask layer arranged above the second magnetic layer;
    wherein the plurality of MTJ elements comprise a first MTJ element as a memory cell comprising a first hard mask layer and a second MTJ element as a memory cell comprising a second hard mask layer, and a dimension of the first hard mask layer is greater than a dimension of the second hard mask layer.

2. The device according to claim 1, wherein the first MTJ element is arranged in a central portion of the memory cell array, and the second MTJ element is arranged on a peripheral portion of the memory cell array.

3. The device according to claim 2, wherein the dimension of the first hard mask layer is greater than the dimension of the second hard mask layer by 10% or more.

4. The device according to claim 1, wherein a side surface of a storage layer of the first MTJ element has a first taper angle, a side surface of a storage layer of the second MTJ element has a second taper angle, and the first taper angle is greater than the second taper angle.

5. The device according to claim 4, wherein the first taper angle is greater than the second taper angle by three degrees or more.

6. The device according to claim 1, the plurality of MTJ elements are arranged in a row direction and a column direction of the memory cell array, and an interval of the MTJ elements in the row direction is wider than an interval of the MTJ elements in the column direction.

7. The device according to claim 6, further comprising:
    a plurality of dummy MTJ elements arranged in an end portion of the memory cell array,
    wherein the plurality of dummy MTJ elements comprise a first dummy MTJ element arranged in a row direction of the memory cell array, and a second dummy MTJ element arranged in a column direction of the memory cell array, and
    wherein a number of second dummy MTJ elements is different from a number of first dummy MTJ elements.

8. The device according to claim 7, wherein the number of second dummy MTJ elements is smaller than the number of first dummy MTJ elements.

9. The device according to claim 1, further comprising:
    a first bit line which is connected to the first hard mask layer of the first MTJ element;
    a first transistor comprising a first gate electrode, a first source region, and a first drain region, one of the first source region and the first drain region being connected to the first magnetic layer of the first MTJ element;
    a second bit line which is connected to the second hard mask layer of the second MTJ element;
    a second transistor comprising a second gate electrode, a second source region and a second drain region, one of the second source region and the second drain region being connected to the first magnetic layer of the second MTJ element.

* * * * *